(12) United States Patent
Calhoun et al.

(10) Patent No.: US 8,954,285 B2
(45) Date of Patent: Feb. 10, 2015

(54) CURRENT DEVICE

(75) Inventors: John S. Calhoun, Starkville, MS (US); William G. Jenkins, Starkville, MS (US); Amos H. Christiansen, Starkville, MS (US)

(73) Assignee: HBM nCode Federal LLC, South Field, MI (US)

( * ) Notice: Subject to any disclaimer, the term of this patent is extended or adjusted under 35 U.S.C. 154(b) by 568 days.

(21) Appl. No.: 13/355,497

(22) Filed: Jan. 21, 2012

(65) Prior Publication Data

US 2013/0024139 A1 Jan. 24, 2013

Related U.S. Application Data

(60) Provisional application No. 61/435,093, filed on Jan. 21, 2011.

(51) Int. Cl.
| | | |
|---|---|---|
| *G01R 31/00* | (2006.01) | |
| *B60L 3/04* | (2006.01) | |
| *G01R 15/20* | (2006.01) | |
| *B60L 3/00* | (2006.01) | |

(52) U.S. Cl.
CPC ............ *G01R 15/202* (2013.01); *G01R 31/006* (2013.01); *B60L 3/0023* (2013.01)
USPC ............................................. 702/58; 702/64

(58) Field of Classification Search
CPC .. G01R 15/202; G01R 31/006; B60L 3/0023; B60L 3/0064; B60L 3/04
USPC .................. 702/57–60, 64, 65; 361/93.9, 57; 340/538, 638, 664
See application file for complete search history.

(56) References Cited

U.S. PATENT DOCUMENTS

| | | | | |
|---|---|---|---|---|
| 4,700,188 A | * | 10/1987 | James ...................... | 340/870.03 |
| 5,491,370 A | * | 2/1996 | Schneider et al. .............. | 310/54 |
| 8,704,654 B1 | * | 4/2014 | Krasowski et al. .......... | 340/538 |
| 2002/0196004 A1 | | 12/2002 | Berson et al. | |
| 2010/0214709 A1 | | 8/2010 | Hall et al. | |

OTHER PUBLICATIONS

PCT International Search Report and Written Opinion for International Application No. PCT/GB2010/050106 dated Jun. 8, 2012.
Chinese Application No. CN 201231692Y (200720076345.0) dated May 6, 2009 with English Abstract.

* cited by examiner

*Primary Examiner* — Manuel L Barbee
(74) *Attorney, Agent, or Firm* — Tumey L.L.P.

(57) ABSTRACT

A device and a method are suitable for use in measuring electric current within an electrical system. The device comprises a current sensor for generating a first signal representative of the electric current within at least one portion of the electrical system, a processor coupled to the output of the current sensor for digitally generating a second signal representative of electric current data based on the first signal, and a transceiver coupled to the processor, where the transceiver transmits the electric current data representative of the second signal to a data collection unit for storage and analysis. The device can be used in the electrical systems of vehicles such as automobiles and trucks; construction, agriculture, and mining equipment; trains; aircraft; and stationary equipment such as generators.

10 Claims, 8 Drawing Sheets

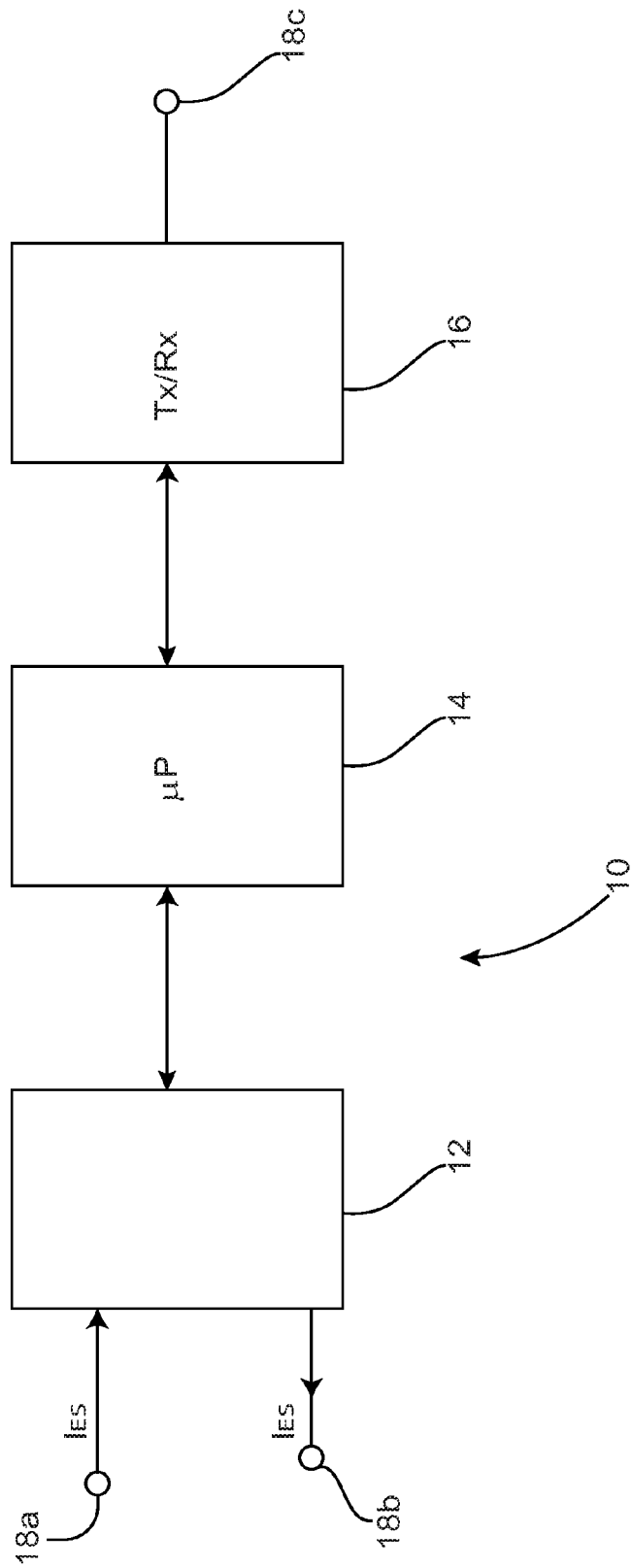

CURRENT DEVICE

CROSS-REFERENCE TO RELATED APPLICATIONS

This application is a non-provisional application that claims the benefit of U.S. Application Ser. No. 61/435,093 filed on Jan. 21, 2011, which is incorporated by reference herein in its entirety.

BACKGROUND OF THE INVENTION

1. Field of the Invention

The present invention relates to a device for measuring and/or monitoring electric current within an electrical system so that the performance or faults within the electrical system can be determined or diagnosed.

2. Background of the Invention

Measuring electrical parameters such as voltage, current, and power in electrical systems is known. There are a large range of useful devices for measuring the current and voltage characteristics of electrical systems, for example voltage and current multimeters. Measuring these parameters in an electrical system is essential to ensure the electrical system is, among other things, operating to specification, operating optimally, or for detecting/predicting and diagnosing faults.

Traditionally, in the event of an electrical fault in an electrical system a technician would be called on to find the fault using a multimeter and a series of instructions from a troubleshooting manual. Based on the instructions, the technician could manually take readings at designated points in the electrical system and compare the readings with those in the manual to determine the fault. This can be a laborious procedure, especially when modifying or prototyping and testing an electrical system.

Measuring and monitoring the electrical parameters of an electrical system is important for determining its performance or predicting and/or diagnosing electrical faults. This is especially important for vehicle and equipment electrical systems as more and more electrical devices/circuits are introduced or installed into the system. Most electrical systems also have limits on their electrical current carrying capabilities, which can lead to unpredictable performance drops and/or electrical faults affecting portions of or the entire electrical system. This is especially the case for vehicles such as automobiles and trucks; construction, agriculture, and mining equipment; trains; aircraft; and stationary equipment like generators, which all rely on a very limited electrical supply for powering the myriad of electronic equipment (circuits and devices), but where it is important that the electrical systems continue to function.

Monitoring and analysing the electrical parameters of an electrical system in real-time allows the electrical system to be adapted or reconfigured to maintain at least a) the function of high priority electrical circuits/devices, b) predicting, detecting, and diagnosing electrical faults, c) rapid repair of electrical faults, and/or d) optimising the operation or performance of the electrical system.

As an example, there is a growing need to understand the power distribution within vehicle and equipment electrical systems as the use of on-board electronics increases as does the necessity for vehicles and equipment to run at their highest performance levels. Although this might be achieved by redesigning the entire vehicle or equipment electrical system to allow various parameters such as current or voltage to be reported for analysis etc, it is not feasible to replace or redesign the electrical systems of existing vehicles and equipment to incorporate this type of analysis/diagnosis function.

Measuring current in a vehicle or equipment system is difficult because of the requirement for an accurate current measurement balanced with the ability to install the equipment to measure the current. Direct path current measurement is more accurate, but requires the current sensor to be placed the current path. In addition, the measured current data needs to be sent to an analysis unit.

It is desirable to have the capability of measuring, monitoring and analysing the important real-time electrical parameters, such as currents and/or voltages, of electrical systems without requiring the entire electrical system to be redesigned for reporting the desired parameters for analysis.

BRIEF SUMMARY OF SOME OF THE PREFERRED EMBODIMENTS

According to the present invention there is provided a device for measuring electric current within a portion of a DC electrical system, the electrical system including a power supply conductor, and the portion of the electrical system including connectors for receiving an over-current protection mechanism, the device comprising:

a Hall effect current sensor arranged in the current path for direct path current measurement, so as to generate a first signal representative of the electric current within the portion of the electrical system;

a first electrical connector and a second electrical connector for connecting the current sensor to the portion of the electrical system;

a processor coupled to an output of the current sensor, wherein the processor digitally generates a second signal representative of electrical current data based on the first signal; and a transceiver coupled to the processor, arranged to transmit the electric current data over the power supply conductor to a data collection unit;

wherein the device is arranged to be connectable by the first and second connectors to the connectors for receiving the over-current protection mechanism, the device being connectable within the footprint of the over-current protection mechanism, and the device also comprising an electrical component coupled to the current sensor between the first and second connectors so the device includes the functionality of the over-current protection mechanism, so the device can replace an over-current protection mechanism.

It will be appreciated that the device can be connected to any portion of the electrical system, without requiring the electrical system to be entirely redesigned to accommodate the device, or multiple devices.

A Hall-effect current sensor is suitable for use in direct current (DC) electrical systems, such as those used in vehicles and equipment, and enables accurate measurements. The current to be measured is arranged to flow through the Hall-effect sensor itself, as this can achieve greater accuracy with variations in temperature. The current to be measured is also used to create the magnetic field that causes the Hall effect.

The transceiver transmits the digital signal over the power supply of the electrical system. This provides a very simple method of using existing infrastructure to communicate the current data, which is also a secure form of communications between the device and the data collection unit which is non-wireless.

The device is arranged to be connectable to the portion of the electrical system by mounting the device within the footprint of at least one existing over-current protection mechanism of the electrical system. It is to be appreciated that the over-current protection mechanism can be at least a fuse, relay, circuit breaker, surge protector, or a combination of these and other devices or items.

In one example, the processor controls the sampling rate of the first signal in response to variations in the current signal. The processor may be configured to detect an increase in electric current or an overrun current condition, and in response to increase the sampling rate of the first signal. The processor may be configured to detect a decrease in the rate-of-change of the electric current and in response, to decrease the sampling rate of the first signal. The transceiver is preferably configured to receive configuration data to configure the processor.

In a second aspect of the invention, there is provided equipment which includes a DC electrical system, and incorporates such a device for measuring electric current within the electrical system, so electric current data is transmitted to a data collection unit of the electrical system.

In this case, the transceiver transmits the digital signal over the power supply conductor of the electrical system. This provides a very simple method of using existing infrastructure to communicate the current data, which is also a secure form of communication between the device and the data collection unit, as it is non-wireless.

It is to be appreciated that the device(s) so far described may be used in electrical systems of vehicles. However, it is also to be appreciated that these devices can also be used in a wide range of different types of equipment with DC electrical systems, such as stationary diesel-powered electric generators.

In another aspect of the invention there is provided an electrical system connected to one or more devices described herein, the one or more devices being in communication with a data collection processor for receiving and storing the transmitted electrical current data for analysis to determine the performance of the electrical system.

Preferably, the data collection processor determines the performance and/or faults of the electrical system based on the received electrical current data.

In another aspect of the present invention there is provided a method of measuring current within a DC electrical system for use in monitoring the performance of the electrical system, the method comprising the steps of generating a first signal representative of an electrical current within at least one portion of the electrical system, digitally processing the first signal into a second signal representative of electrical current data, and transmitting the electrical current data to a data collection unit for storage and analysis.

The foregoing has outlined rather broadly the features and technical advantages of the present invention in order that the detailed description of the invention that follows may be better understood. Additional features and advantages of the invention will be described hereinafter that form the subject of the claims of the invention. It should be appreciated by those skilled in the art that the conception and the specific embodiments disclosed may be readily utilized as a basis for modifying or designing other embodiments for carrying out the same purposes of the present invention. It should also be realized by those skilled in the art that such equivalent embodiments do not depart from the spirit and scope of the invention as set forth in the appended claims.

BRIEF DESCRIPTION OF THE DRAWINGS

The invention will now be further and more particularly described, by way of example only, and with reference to the accompanying drawings in which:

FIGS. 1a and 1b show examples of a device according to the invention;

DETAILED DESCRIPTION OF THE PREFERRED EMBODIMENTS

Figure 1B:
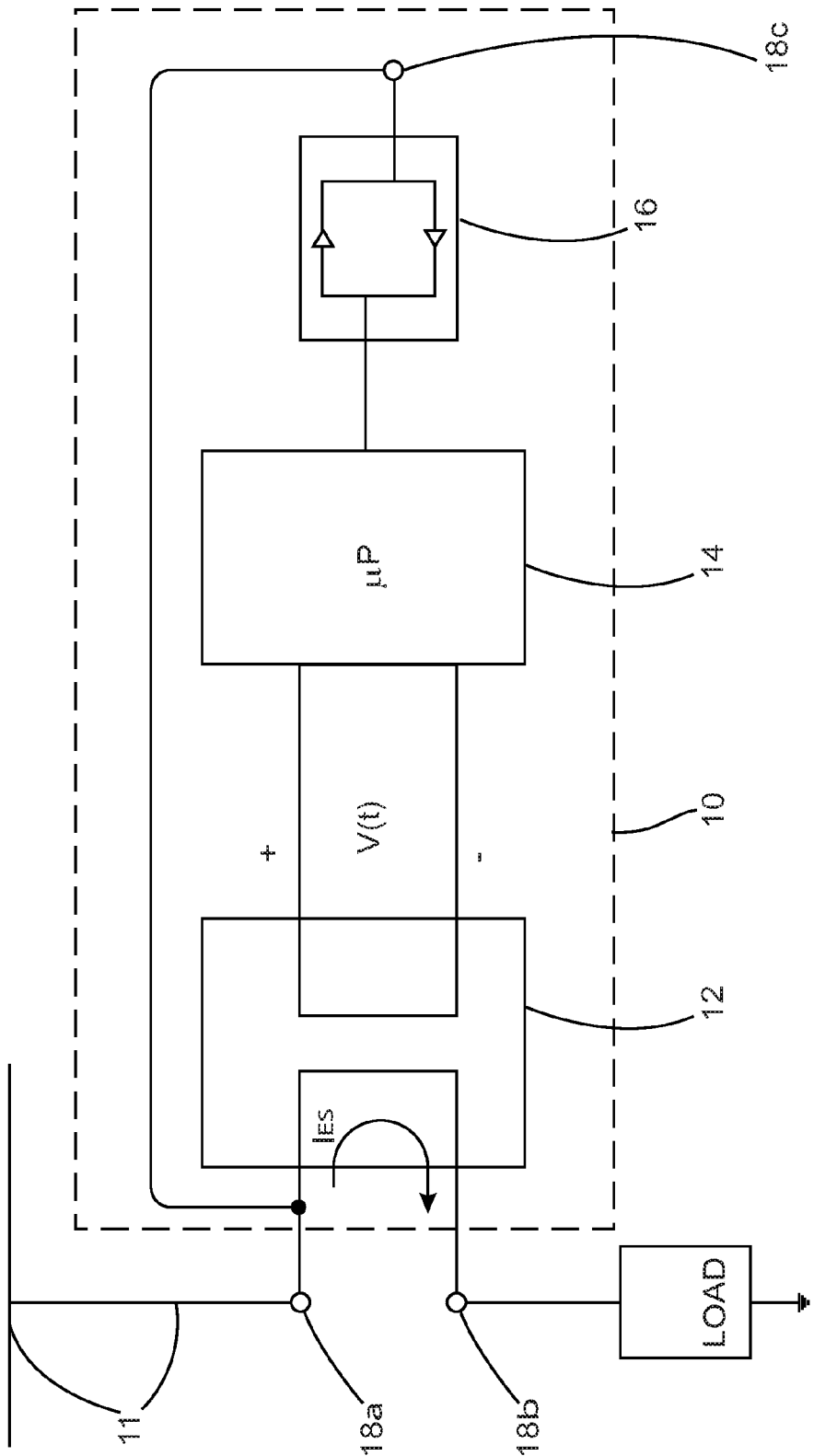

Referring now to FIG. 1a, there is shown a device 10 for measuring electric current within an electrical system (not shown). The device includes a current sensor 12 for generating a first signal representative of the electric current within at least one portion of the electrical system, a processor 14 coupled to the output of the current sensor 12 for digitally generating a second signal representative of electric current data based on the first signal, and a transceiver 16 coupled to the processor 12, where the transceiver 16 transmits the electric current data representative of the second signal to a data collection unit (not shown) for storage and analysis.

In operation, the device 10 is connected to a portion of the electrical system via a first and a second connector 18a and 18b, respectively. The device 10 is connected within the current path with current input to the first connector 18a and the current output via the second connector 18b. The current sensor is arranged to measure the current flowing between the connectors 18a and 18b. In a direct current (DC) electrical system, the current sensor can be a Hall-effect device, which generates a magnetic field which is sensed by the integrated Hall-effect circuit, so generating an output voltage. The device 10 with such a current sensor could be used to measure and monitor current in portions of DC electrical systems used in vehicles and equipment.

In order to conveniently connect the device 10 to a portion of the electrical system that is to be measured and/or monitored, the device 10 can be arranged to be connectable to an existing electrical component holder (not shown), mounting, plug or connector that connects the electrical component to the electrical system. For example, the first and/or a second connector 18a and 18b can be arranged such that the device 10 is mountable within the footprint of at least one existing over-current protection mechanism (not shown) of the electrical system. It is to be appreciated that the over-current protection mechanism can be at least a fuse, relay, circuit breaker, surge protector, or a combination of these and other devices or items.

It may be desirable for device 10 to include the functionality of an electrical component (not shown), while at the same time measuring and monitoring current and transmitting current data to a data collection and analysis unit. This means that the device 10 could continue to function as the electrical component while also allowing current data to be collected and analysed.

If the electrical component is an over-current protection mechanism such as an automobile fuse, then device 10 could include the automobile fuse, or a fuse or relay with a similar rating, so that it can be installed into the fuse-box to measure the current between the fuse and the electrical load or equipment protected by the fuse.

By including the functionality of an electrical component of the electrical system into device 10, this provides the advantage that device 10 can simply replace an original electrical component as an intelligent version of the electrical component, which therefore includes the functionality of measuring and monitoring current between the electrical component and an electrical load or equipment. This would allow device 10 to be installed into existing electrical systems with minimal or no modification required to the electrical system. Because they are typically replaceable, it has been found that the over-current protection mechanisms used in electrical systems are ideal electrical components.

The transceiver 16 transmits the digital signal as current data from a third connector 18c, when the third connector 18c is coupled to a communications medium such as a power supply bus or conductor 11 (see FIG. 1b) of the electrical system. The advantage of using the power supply bus or conductor 11 is that the device 10 can make use of the existing infrastructure of the electrical system to communicate the electrical current data to the data collection or analysis unit. This can also be a more secure form of communication between the device 10 and the data collection and/or analysis unit, as it is non-wireless. If it is inconvenient to use the power supply conductor 11, e.g. due to restrictions in bandwidth, or because the power supply conductor 11 is already being used for other forms of communication, then it is to be appreciated that the transceiver 16 could be arranged to transmit the digital signal to the data collection unit wirelessly. Both of these communication solutions would minimise any changes to the electrical system when installing device 10. Failing this, a dedicated communication line e.g. a LAN cable or twisted pair could be installed to transmit the current data.

The processor 14 can be a microprocessor having several functions. The processor 14 would convert the first signal, which is typically an analog voltage output by the current sensor, into a digital signal via an on-board analog-to-digital convertor (ADC). The processor 14 can also be programmed or configured to monitor the current that is being measured for current overruns. If a current overrun appears to be occurring, then the processor 14 can increase the sample rate of the ADC or the current sensor to provide higher fidelity data. This is particularly useful when the current overrun gets to the point when a fuse blows or relay fires/trips. Parameters could also be programmed into the processor either at start-up of device 10 or during the operation of device 10 by interfacing with the transceiver 16, which can receive commands and the like from an external source such as the data collection/analysis unit. The commands may be used to adjust thresholds in the processor related to the sampling rate or relay trip points, or even allow the device 10 to implement a range of ratings for multiple fuse/circuit breakers, e.g. 5 A/10 A/15 A/20 A/25 A/30 A/35 A/40 A/45 A/50 A, when device 10 is configured to include the functionality of a fuse/circuit breaker.

During operation of device 10 the processor 14 receives the first signal from the current sensor 12, which can be in the form of an analog signal such as an analog voltage. The processor 14 can then control the sampling rate of the first signal in response to variations in the current signal. For example, in the event of a fault or possible fault the electric current may increase, or if an overrun current condition begins to exist, the processor 14 is configured to detect the increase in electric current, and in response to detecting the increase, the processor 14 increases the sampling rate of the first signal. This allows the current to be monitored and analysed in more detail so that the possible electrical fault can be identified, or so that the system is monitored during the fault to establish the cause. In addition, the processor 14 can be configured to detect a decrease in the rate-of-change of electric current and in response can decrease the sampling rate of the first signal. This ensures that only the essential information is relayed to the data collection unit.

Since the transceiver 16 is coupled to the processor 14, the transceiver 16 can be configured to receive processor configuration data on the third connector 18c to configure or re-configure the processor 14. This allows the device 10 to be configured or adapted in real-time, or modified during installation so that the device 10 can measure and monitor the current for the particular situation or application.

Referring now to FIG. 1b, there is shown the device 10 according to FIG. 1a but adapted for measuring electric current by coupling first and second connectors to a portion of a DC electrical system between the power supply conductor 11 and a load. The current sensor 12 is a Hall-effect current sensor 12 for generating a first signal, denoted by voltage V(t), which is representative of the electric current $I_{ES}$ within the portion of the electrical system. The processor 14 is coupled to the output of the current sensor 12 and receives the analog signal V(t) and performs an analog-to-digital conversion to generate a second signal representative of electric current data based on the first signal. The transceiver 16 coupled to the processor 14 is a power line communication transceiver. The third connector 18c of the transceiver is coupled to the first connector 18a at the input of device 10 allowing transceiver 16 to transmit electric current data over the power supply conductor 11 of the electrical system to a data collection unit 42 (shown in FIG. 4) for storage and analysis. To further protect the load and/or the device 10, an over-current protection mechanism could be included into device 10 or in series with device 10.

Figure 2A:
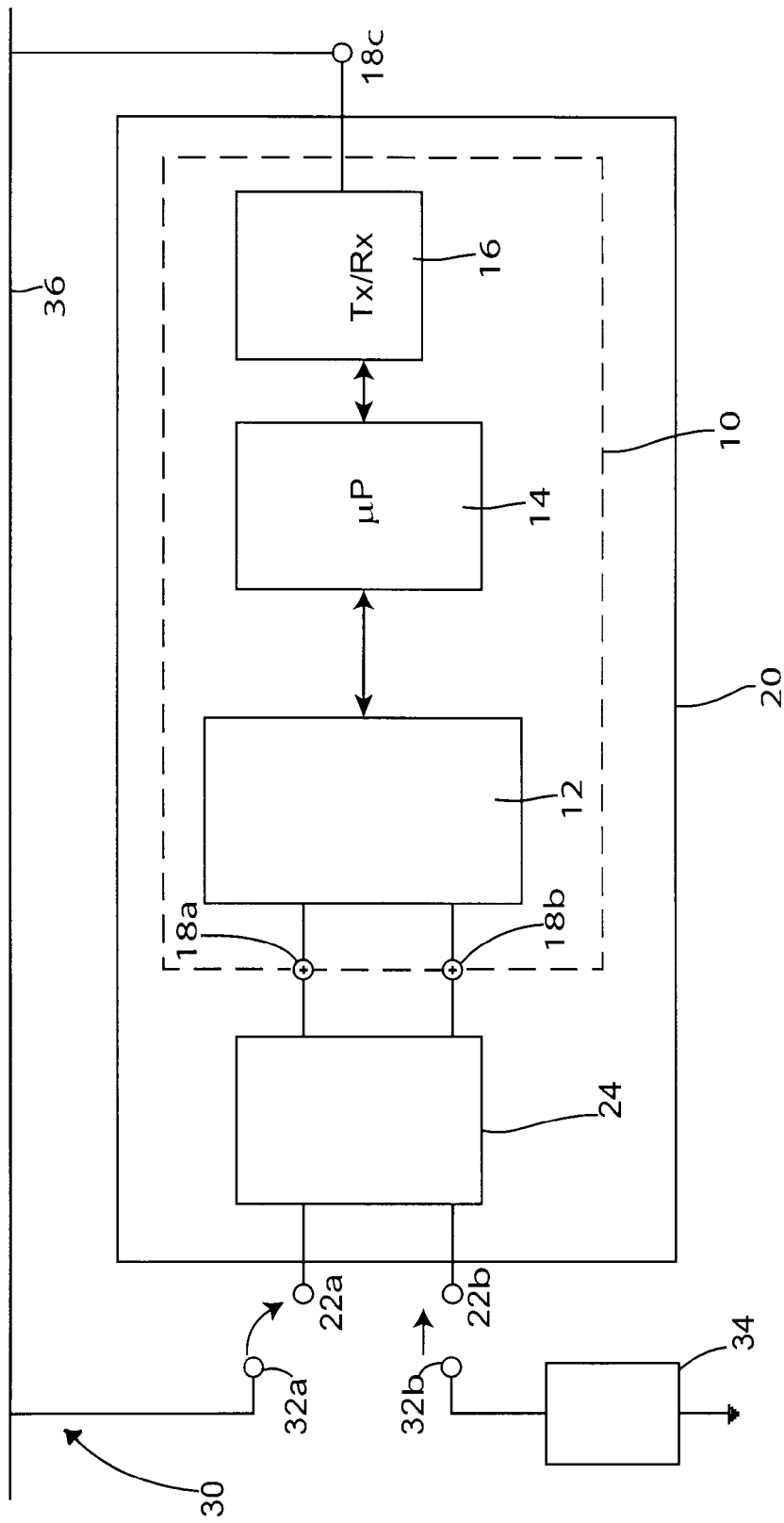
FIGS. 2a, 2b, and 2c show examples of a device according to the invention.

Referring now to FIG. 2a, a device 20 is shown that includes device 10 as described with reference to FIG. 1a or 1b for measuring electric current within a portion of an electrical system 30. It can be seen that current sensor 12 is coupled to an electrical component 24, which is preferably an over-current protection mechanism. The device 20 is arranged to be connectable by device connectors 22a and 22b to corresponding connectors 32a and 32b of an electrical component (not shown) of the electrical system 30. The electrical component connectors 32a and 32b would ordinarily only receive an electrical component like an over-current protection mechanism (not shown) such as a fuse, relay, or circuit breaker that protects electrical load 34.

The transceiver 16 is arranged to transmit the digital signal over a power supply conductor 11 of the electrical system 30. This is achieved by connecting the third connector 18c to the power supply conductor 11. It is to be appreciated that the third connector 18c could instead be connected to the power supply conductor 11 via the first and second connectors 18a or 18b or the device connectors 22a or 22b. It is also to be appreciated that any other form of transmission of the current data can be used.

Preferably the electrical component 24 of device 20 is an over protection mechanism 24, such that device 20 can be arranged and configured to be connectable to the connectors 32a and 32b of the overprotection mechanism holder of the electrical system 30. This allows device 20 to be mountable via the device connectors 22a and 22b to connectors 32a and 32b within the footprint of the over-current protection mechanism. Device 20 can be used to replace an existing over-current protection mechanism used in the electrical system 30 for protecting an electrical load 34 without compromising the electrical system 30.

It is to be appreciated that the over-current protection mechanism 24 can include one or more of fuses, relays, circuit breakers, surge protectors, or a combination of these and other suitable devices or items. Packaging the device 20 into the footprint of an existing fuse/relay/circuit breaker makes it easier to install the device 20 to collect measured current data.

The over-current protection mechanism 24 could be incorporated into device 10 or 20 as a sub-miniature relay or a surface mounted device fuse. An advantage of using relays as circuit breakers is that they are resettable and hence the whole device 10 or 20 will not need to be replaced in the occurrence of an over-current condition due to an electrical fault. An advantage of using surface mounted fuses is that they can be easily replaced making repair of the device 10 or 20 manageable.

Figure 2B:
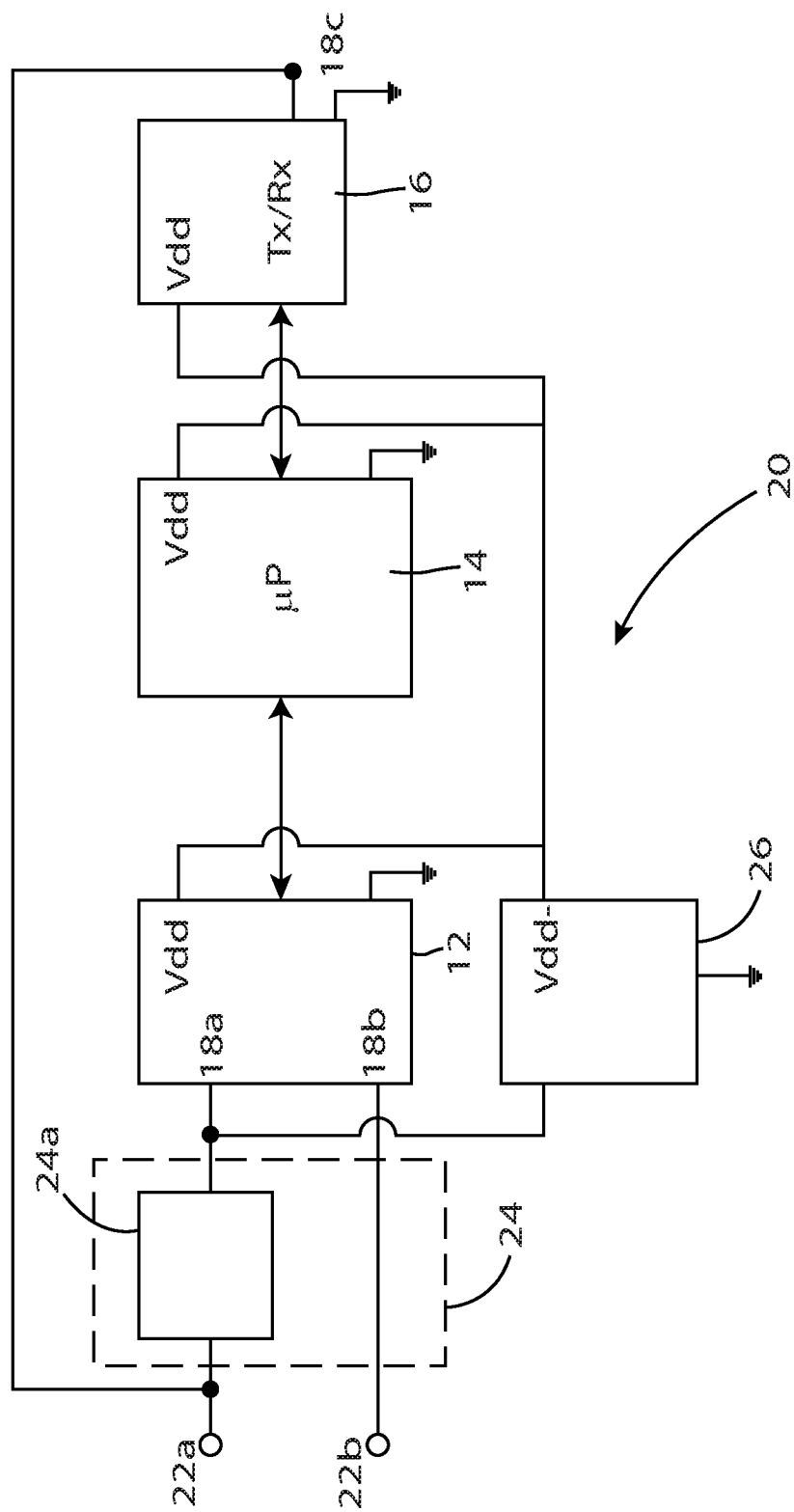

Referring now to FIG. 2b, an example implementation of the device 20 is shown. The over-current protection mechanism 24 is implemented with an appropriate electrical component 24a such as a surface mounted device fuse or a resettable relay or circuit breaker. The electrical component 24a is positioned in series between device connector 22a and the first connector 18a for inputting current into current sensor 12. The second connector 18b is connected to device connector 22b for completing the current circuit.

The electrical path between the electrical component 24a and first connector 18a is also connected to an internal power supply 26, which is used to provide power to current sensor 12, microprocessor 14, and transceiver 16. The power supply 26 taps into the power supply of the electrical system to provide a standardised power supply, indicated as Vdd, to the components of device 20. The current sensor 12 is coupled (as previously described) to the microprocessor 14, which in turn is coupled to transceiver 16. The transceiver 16 is a power line communication transceiver and in this example its transmitter/receiver output/input is connected to device connector 22a such that when device 20 is mounted into an over-current protection mechanism holder of the electrical system, the power line communication transceiver 16 is able to communicate over the power supply conductor 11 of the electrical system.

Figure 2C:
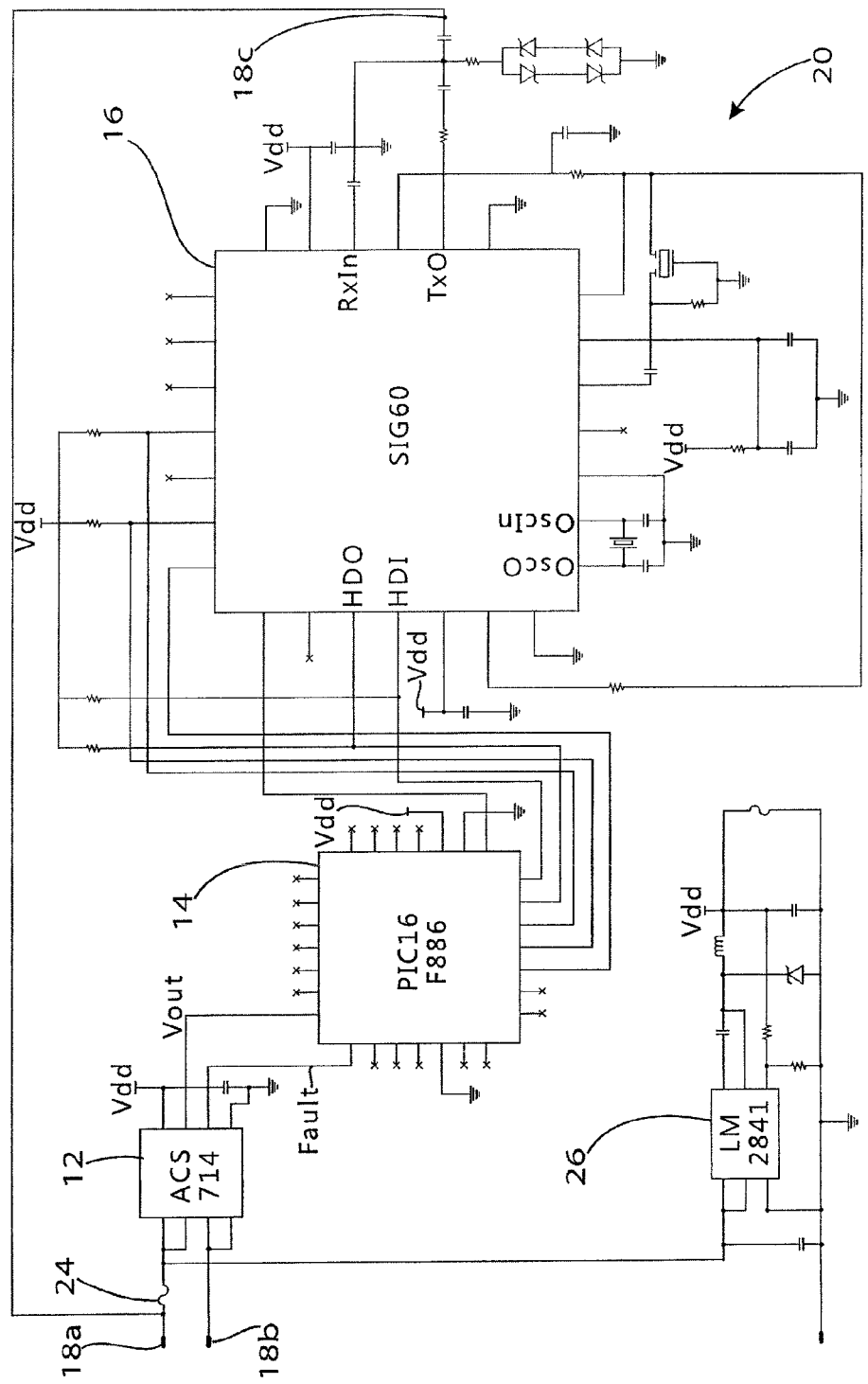

Referring now to FIG. 2c, an example circuit diagram of device 20 for use in a vehicle or equipment electrical system is shown. In this example, the components used are various off-the-shelf integrated circuits that implement the electrical component 24 that the device 20 is designed to replace in the electrical system, the power supply 26, the Hall-effect current sensor 12, the micro processor 14, and transceiver 16, the functions of which have already been described with reference to FIGS. 1a to 2c.

In this example, the electrical component 24 is a surface mounted device fuse, which for automobiles can be in the range of 5 A to 40 A. The power supply 26 is designed to output 3.3 V DC for use by the current sensor 12, the micro processor 14, and transceiver 16. In particular, the power supply 26 is a National Semiconductor LM2841, which is a 300 mA step-down DC/DC regulator. However, it is to be appreciated that many alternative power supplies can be used. The current sensor 12 is an Allegro Microsystems ACS714 Hall-effect current sensor with over-current fault output for <100 V isolation applications. This type of current sensor is optimised for low-side current sensing applications and electrically isolates the current being measured from the microprocessor 14 and transceiver 16. The transceiver 16 is a YAMAR Electronics Ltd SIG60 universal asynchronous receiver/transmitter (UART). It is to be appreciated that equivalent components can be used to implement device 20.

Figure 3A:
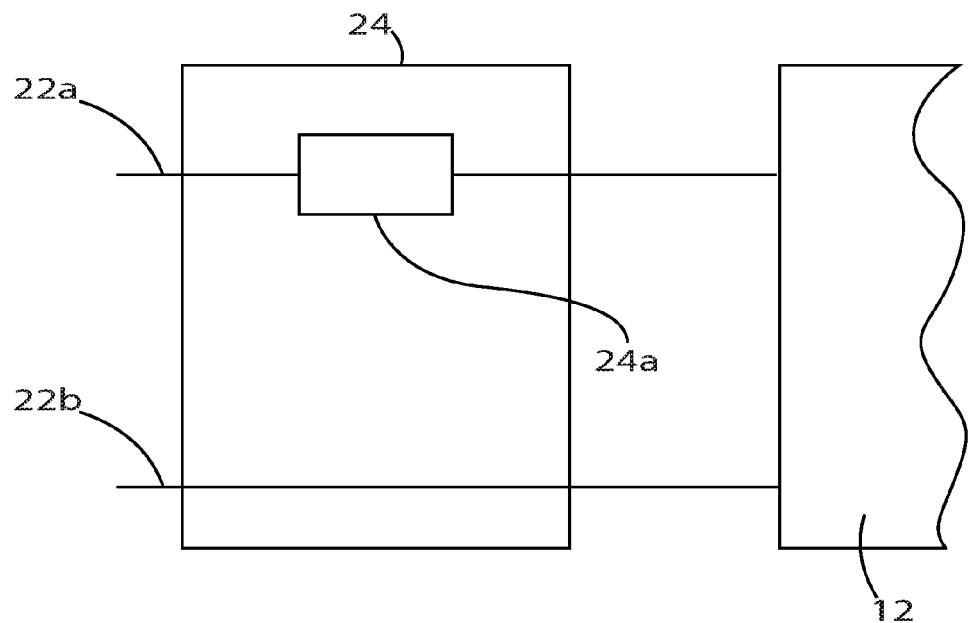
FIGS. 3a, 3b, and 3c show examples of an over-current protection mechanism for use with a device according to the invention.
Figure 3B:
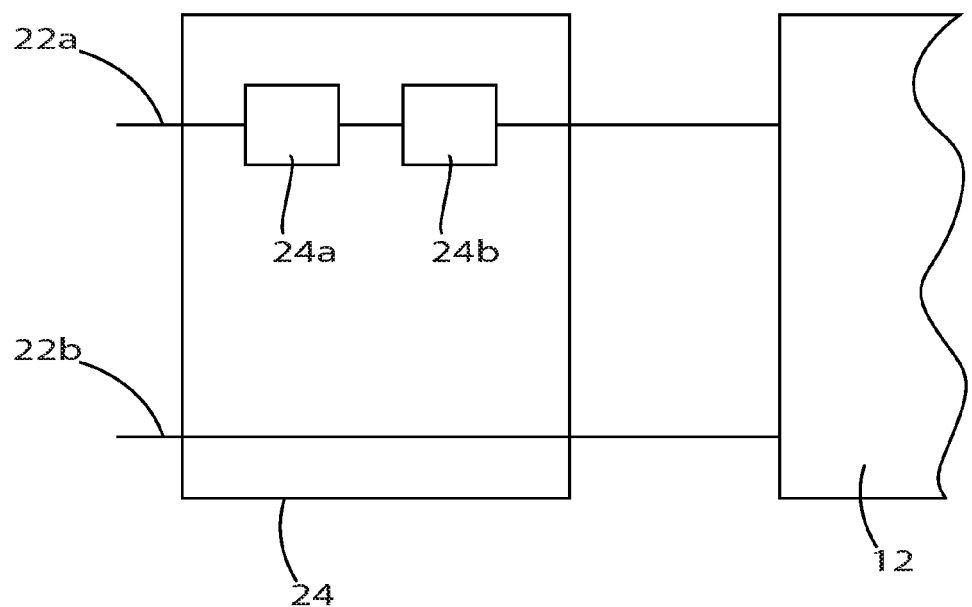
Figure 3C:
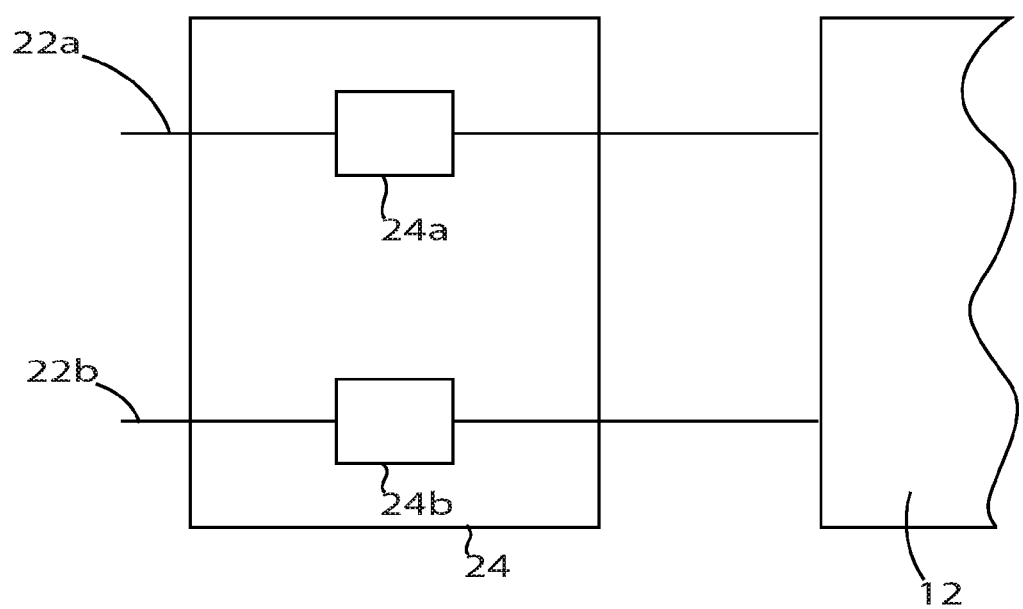

Referring now to FIGS. 3a to 3c, several examples of an over-current protection mechanism 24 for use with device 20 (or device 10) are shown. The over protection mechanism 24 includes an input electrical line 22a that is coupled to the input of the current sensor 12, and an output electrical line 32b that is also coupled to the input of the current sensor 12.

In FIG. 3a, the over-current protection mechanism 22 includes an electrical component 24a such as a fuse on the input electrical line 22a. The fuse could be a surface mountable device, which may be replaced after it breaks during an electrical fault. Alternatively, the electrical component 24a could be a relay or circuit breaker, which is either automatically or manually resettable. If the relay is automatically resettable, the processor 14 of device 20 could be coupled to the relay and configured or programmed to detect the electrical fault and switch the relay off. Alternatively, the processor 14 could be instructed via the transceiver 16 by the data collection unit or other system external to device 20 but in communication with device 20 via transceiver 16 to switch the relay back on.

In FIG. 3b, the over-current protection mechanism 24 includes two electrical components 24a and 24b, which could be a fuse and a relay in series on the input electrical line 22a. These could be arranged in any order so that the relay provides a form of surge protection before the fuse breaks during an electrical fault, which would minimise the need to replace the fuse. The relay could then be switched as described above with respect to FIG. 3a.

In FIG. 3c, a first electrical component 24a such as a fuse is positioned on the input electrical line 22a and a second electrical component 24b such as a relay is positioned on the output electrical line 22b. The positioning of the fuse and relay could also be reversed. It will be appreciated that various combinations of fuses, relays, circuit breakers, and/or surge protectors and other electrical components and the like can be included in the over-current protection mechanism 22.

It is to be appreciated that the devices 10 and 20 are suitable for use in electrical systems of vehicles and other mobile equipment. However, it is also to be appreciated that these devices 10 and 20 can also be suitable for use in stationary electrical systems.

Figure 4:
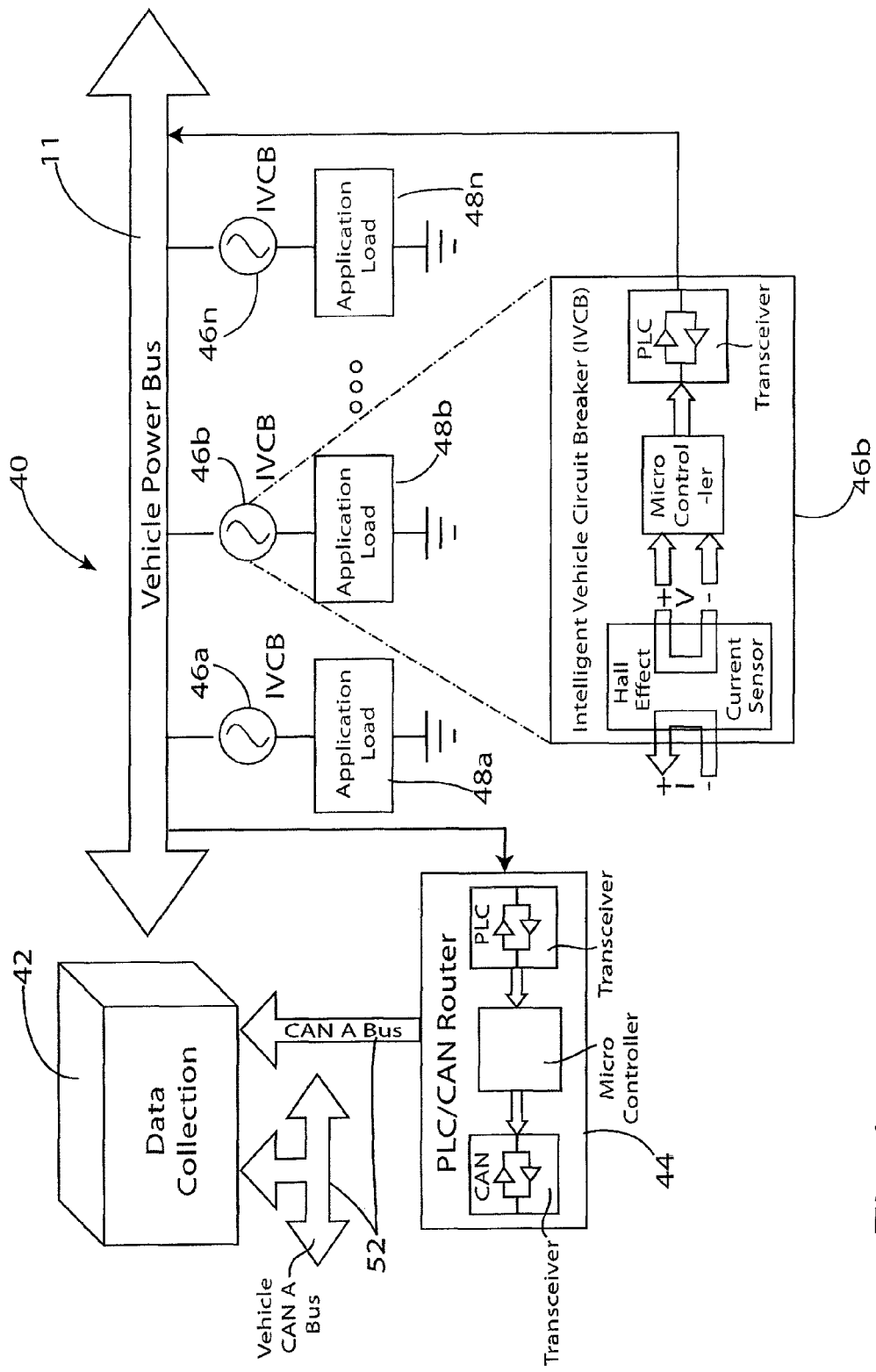
FIG. 4 shows an example of an electrical system connected to one or more devices according to the invention.

Referring now to FIG. 4, an electrical system 40 of a vehicle is shown. The electrical system 40 includes a data collection and analysis unit 42 for receiving the electrical current data from one or more devices 46a to 46n; the data collection and analysis unit 42 may be coupled via a router 44 and a data communication network 52. The devices 46a to 46n can be based on devices 10 or 20 as described with reference to FIGS. 1 to 3. Preferably they are based on device 20 and configured to be intelligent relays, circuit breakers or fuses. The devices 46a to 46n are arranged to be mounted in the footprints of a corresponding number of previously-connected over-current protection mechanisms of the electrical system 40, each device 46a to 46n taking the place of an over-current protection mechanism. The devices 46a to 46n are connected in series with corresponding electrical loads 48a to 48n.

Device 46b is shown to have a transceiver 16 that is connected to the power supply bus or conductor 11 of the electrical system 40. It is assumed that each of the other devices 46a, 46c to 46n is also in communication over the power supply conductor 11 with the data collection and analysis unit 42. The data collection and analysis unit 42 receives the current data from devices 46a to 46n for storage and analysis to determine the performance and/or diagnose faults of electrical system 40.

It is to be appreciated that at least portions of the devices 10, 20, 46a to 46n, and/or the electrical system 40 can be implemented on a computer readable medium including computer program instructions stored thereon, which when executed on one or more processors of the devices or electrical system, performs a method of measuring current within an electrical system for use in monitoring the performance of the electrical system, and/or for identifying electrical faults of the electrical system.

As an example, the method can include generating a first signal representative of an electrical current within at least one portion of the electrical system, digitally processing the first signal into a second signal representative of electrical current data, and transmitting the electrical current data to a data collection unit for storage and analysis. The digital processing could further include controlling the sampling rate of the first signal in response to variations in the current signal, and/or detecting an increase in electric current or an overrun current condition and in response increasing the sampling rate of the first signal, and/or detecting a decrease in the rate-of-change of the electric current and in response decreasing the sampling rate of the first signal, and/or receiving configuration data to configure a processor for performing the digital processing.

In another example, if the device includes an electrical component that can be controlled by being turned on or off, then the processors could be instructed or programmed to automatically switch the electrical component on or off if an electrical fault is detected or imminent, or to optimise the performance of the electrical system. An example of such an electrical component may be a relay or circuit breaker. The processor(s) could be connected to the relay and could include instructions to switch the relay or circuit breaker or configured or programmed to detect the electrical fault and switch the relay or circuit breaker when it trips. Alternatively, the processor(s) could be instructed via the transceiver of the device by the data collection unit or other system external to the device but in communication with device via transceiver to switch the relay or circuit breaker.

Although the present invention and its advantages have been described in detail, it should be understood that various changes, substitutions and alterations may be made herein without departing from the spirit and scope of the invention as defined by the appended claims.

What is claimed is:

1. A device for measuring electric current within a portion of a DC electrical system, the electrical system including a power supply conductor, and the portion of the electrical system including connectors for receiving an over-current protection mechanism, the device comprising:
   a Hall effect current sensor arranged in the current path for direct path current measurement, so as to generate a first signal representative of the electric current within the portion of the electrical system;
   a first electrical connector and a second electrical connector for connecting the current sensor to the portion of the electrical system;
   a processor coupled to an output of the current sensor, wherein the processor digitally generates a second signal representative of electrical current data based on the first signal; and
   a transceiver coupled to the processor, arranged to transmit the electric current data over the power supply conductor to a data collection unit;
   wherein the device is arranged to be connectable by the first and second connectors to the connectors for receiving the over-current protection mechanism, the device being connectable within the footprint of the over-current protection mechanism, and the device also comprising an electrical component coupled to the current sensor between the first and second connectors so the device includes the functionality of the over-current protection mechanism, so the device can replace an over-current protection mechanism.

2. The device of claim 1, wherein the electrical component includes a fuse.

3. The device of claim 1, wherein the electrical component includes a relay or a circuit breaker.

4. The device of claim 1, wherein the processor is arranged to control the sampling rate of the first signal in response to variations in the current signal.

5. The device of claim 1, wherein the processor is configured to detect an increase in electric current or an overrun current condition and in response to increase the sampling rate of the first signal.

6. The device of claim 1, wherein the processor is configured to detect a decrease in the rate-of-change of electric current and in response to decrease the sampling rate of the first signal.

7. The device of claim 1, wherein the transceiver is configured to receive configuration data to configure the processor.

8. Vehicle or equipment comprising a DC electrical system and one or more devices according to claim 1 connected to the electrical system for measuring current in the electrical system.

9. The vehicle or equipment as claimed in claim 8, comprising a fuse box, wherein a plurality of fuses within the fuse box are replaced by devices according to claim 1, wherein each device fits within the footprint of the fuse that is replaced, and the device includes the functionality of the fuse that is replaced.

10. A DC electrical system comprising:
   a power supply conductor and at least one electrical load connected to the power supply conductor;
   at least one device according to claim 1, the at least one device being connected to the power supply conductor before the at least one electrical load and being in communication with a data collection processor for receiving and storing the transmitted electrical current data for analysis to determine the performance or identify electrical faults of the electrical system.

* * * * *